United States Patent [19]

Ferri, Jr. et al.

[11] Patent Number: 5,803,599

[45] Date of Patent: Sep. 8, 1998

[54] APPARATUS AND METHOD FOR MIXING CHEMICALS TO BE USED IN CHEMICAL-MECHANICAL POLISHING PROCEDURES

[75] Inventors: Edward T. Ferri, Jr., Gilroy, Calif.; J. Tobin Geatz, Durham, N.C.; Gary L. Corlett, Hollister, Calif.

[73] Assignee: Applied Chemical Solutions, Hollister, Calif.

[21] Appl. No.: 898,882

[22] Filed: Jun. 27, 1997

Related U.S. Application Data

[63] Continuation of Ser. No. 667,360, Jun. 21, 1996, abandoned, which is a continuation of Ser. No. 277,229, Jul. 19, 1994, abandoned, which is a continuation-in-part of Ser. No. 948,392, Sep. 21, 1992, Pat. No. 5,330,072, which is a continuation-in-part of Ser. No. 583,826, Sep. 17, 1990, Pat. No. 5,148,945.

[51] Int. Cl.$^6$ ............................... B01F 15/02; B67D 5/54
[52] U.S. Cl. ........................ 366/134; 366/137; 366/160.5; 366/182.1; 366/191; 137/205; 137/209; 137/268
[58] Field of Search ..................... 366/134, 136, 366/137, 139, 141, 152.1, 152.2, 159.1, 160.1, 160.5, 162.1, 163.1, 182.1, 182.3, 182.4, 191; 137/205, 209, 268, 563; 222/1, 56, 135, 152, 318, 59, 61

[56] References Cited

U.S. PATENT DOCUMENTS

| 1,460,389 | 7/1923 | Mauclere . |
| 2,362,724 | 11/1944 | Shea . |
| 3,199,957 | 8/1965 | Vivion ..................................... 137/268 |

(List continued on next page.)

FOREIGN PATENT DOCUMENTS

| 0354665 | 12/1990 | European Pat. Off. . |
| 8203023 | 9/1982 | WIPO . |

OTHER PUBLICATIONS

Chemfill—Chemical Delivery System—Brochure of FSI International, Chaska, Minn., Feb., 1988.

"System Overview and Installation Planning" and Overview of Computerized Chemical Distribution Systems—Brochure of Systems Chemistry Inc., Milpitas, Calif., May 1989.

"Unique Solutions to the Handling and Dispensing of Chemicals With a Commitment to Quality and Support"—Integrated Designs, Inc., Dallas, Texas.

*Primary Examiner*—Charles E. Cooley
*Attorney, Agent, or Firm*—Faegre & Benson LLP

[57] ABSTRACT

Apparatus for the delivery of a chemical slurry to at least one downstream facility. The apparatus comprises a measuring vessel of predetermined volume into which a liquid chemical component is introduced. A conduit connects the measuring vessel to multiple chemical sources, wherein each of said chemical sources comprises a liquid chemical component. Another conduit connects the measuring vessel to at least one mix tank. A pressure-vacuum vessel is in communication with said at least one mix tank, whereby chemical is drawn from said at least one mix tank to the pressure-vacuum vessel under negative pressure and chemical is delivered from the pressure-vacuum vessel to said at least one downstream facility under positive pressure. The pressure-vacuum vessel is in fluid communication with both said at least one mix tank and said at least one downstream facility. Valves on each of the conduits control the chemical flow therethrough. The chemical slurry is produced in said least at one mix tank by combining chemicals from one or more of the multiple chemical sources, and the slurry is delivered from said at least one mix tank to said at least one downstream facility.

4 Claims, 12 Drawing Sheets

U.S. PATENT DOCUMENTS

| | | |
|---|---|---|
| 3,370,755 | 2/1968 | Querner . |
| 3,746,570 | 7/1973 | McIntosh . |
| 3,877,682 | 4/1975 | Moss . |
| 3,960,295 | 6/1976 | Horak . |
| 4,019,528 | 4/1977 | Tyrrell . |
| 4,106,671 | 8/1978 | Sharples . |
| 4,204,612 | 5/1980 | Schrader et al. . |
| 4,215,719 | 8/1980 | Laar et al. . |
| 4,223,806 | 9/1980 | Buschmann . |
| 4,380,248 | 4/1983 | Ambrus et al. . |
| 4,475,821 | 10/1984 | Koch et al. . |
| 4,523,854 | 6/1985 | Beckley ............................ 366/134 X |
| 4,580,699 | 4/1986 | Black et al. . |
| 4,651,780 | 3/1987 | diVincenzo . |
| 4,823,987 | 4/1989 | Switall . |
| 4,863,277 | 9/1989 | Neal et al. ............................ 366/137 |
| 5,148,945 | 9/1992 | Geatz . |
| 5,181,533 | 1/1993 | Kooi ....................... 137/268 |
| 5,340,210 | 8/1994 | Patel et al. ........................ 366/141 X |

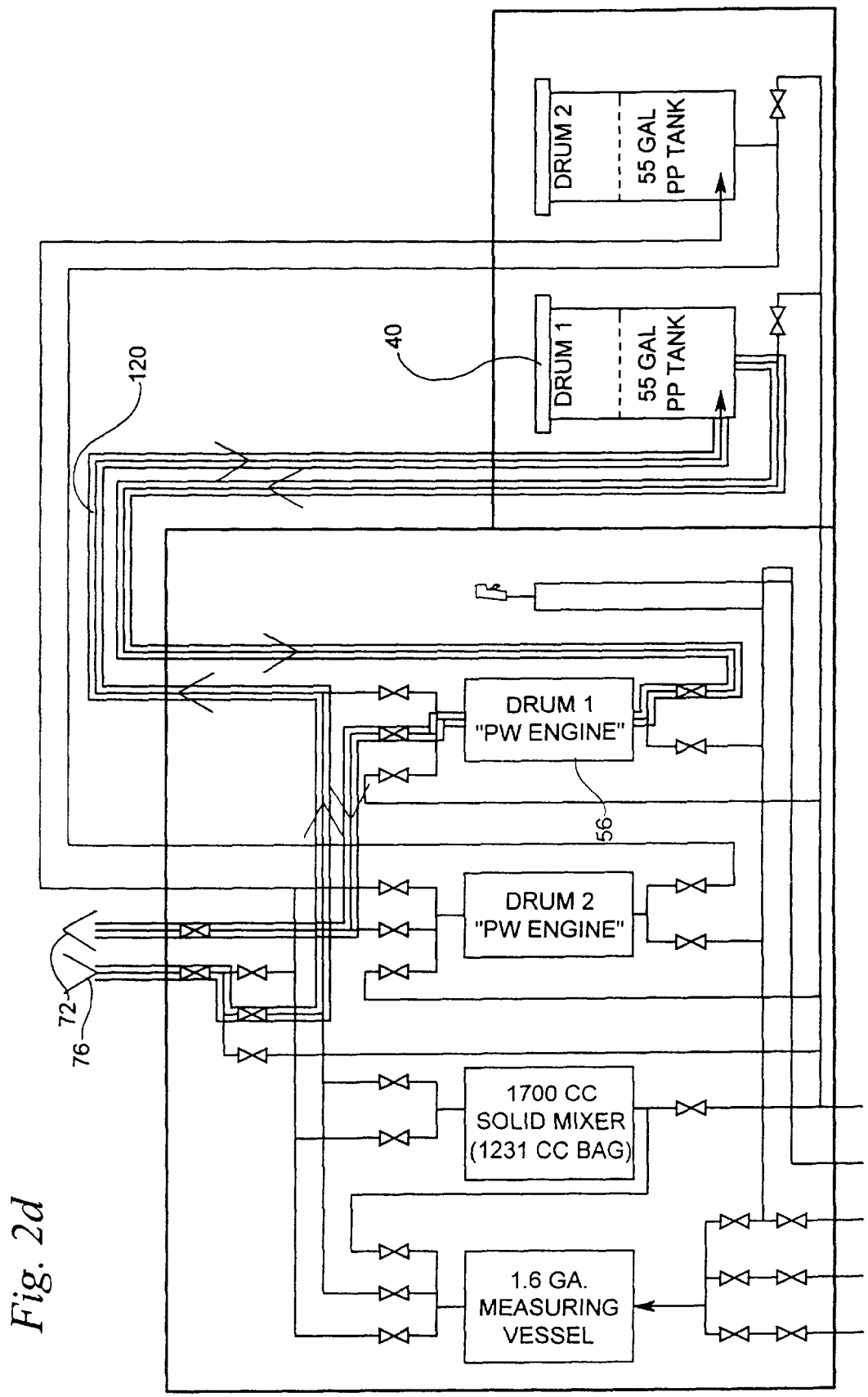

APPARATUS AND METHOD FOR MIXING CHEMICALS TO BE USED IN CHEMICAL-MECHANICAL POLISHING PROCEDURES

This is a continuation of Ser. No. 08/667,360, filed Jun. 21, 1996, now abandoned, which is a continuation of Ser. No. 08/277,229, filed Jul. 19, 1994, now abandoned, which is a continuation-in-part of Ser. No. 07/948,392, filed Sep. 21, 1992, now issued as U.S. Pat. No. 5,330,072, which is a continuation-in-part of 07/583,826, filed Sep. 17, 1990, now issued as U.S. Pat. No. 5,148,945.

BACKGROUND OF THE INVENTION

1. Field of the Invention

The present invention relates to apparatus and method for producing and supplying suspensions and slurries, and particularly abrasive slurries used in chemical-mechanical polishing procedures such as those used in the production of integrated circuits.

2. Background of the Prior Art

Chemical Mechanical Polishing (CMP) is a process by which an abrasive slurry is applied over a surface (e.g., metal or silicon) during electronic wafer production and mechanical polishing is performed to produce a flat, uniform surface. CMP is viewed as a vital process necessary for the development and high yield production of improved multi-layered integrated circuit (IC) devices, especially those with a geometry of 0.35 micron and smaller. One key consideration in establishing a CMP procedure is how to provide high volume, cost effective, and reliable delivery of chemicals for the CMP procedure. While deionized (DI) water is regularly available in most clean manufacturing environments, other chemicals, such as oxide and metal slurries, are hazardous chemicals that must be carefully handled, mixed, and delivered.

Complicating the process of supplying chemicals for use in CMP procedures is the fact that slurries of polishing agents are, by necessity, highly abrasive. Accordingly, apparatus used to mix or transfer such chemicals are prone to wear and premature failure. For instance, conventional pump devices will rapidly degrade when subjected to many polishing slurries. Further, precipitation of solids in conduits can cause serious and expensive maintenance problems.

Generally, a slurry comprises a very fine abrasive (20 to 80 nm) suspended in a liquid (predominately water). Two basic categories of slurries used in CMP procedures are oxide removing slurries and metal removing slurries. Each of these slurries has its own handling and use constraints.

The slurries that are easiest to handle and use are oxide removing slurries. These usually comprise fumed silica particles in colloidal suspension in a slightly basic dilution of KOH (usually <1%). Typical compositions consist of approximately 10% solids, have a specific gravity range of just over 1.0 to about 1.1, and have a viscosity of <50 cps. Colloidal suspension can be maintained by keeping the pH in a 10 to 12 pH range. With proper temperature control, these slurries have a shelf life of up to one year.

Metal removing slurries are newer to CMP processing and present demanding handling requirements. These slurries are used to remove copper, aluminum, tungsten, and similar metals and are highly abrasive. They generally have less solid suspensions and may have a pH as low as 2. Compared to oxide removing slurries, metal removing slurries have very short shelf lives, usually requiring use within hours of production. Further complicating the use of these compositions is the fact that certain abrasives (e.g., alumina abrasive) are not colloidal suspensions, requiring mechanical agitation prior to and during the chemical delivery operation. In some cases, such slurries may require the combination of two or three liquid components and one or more dissolved or suspended solid components, all of which require constant mixing and movement right up until use. Some newer slurries may also require elevated temperature prior to use.

One of two methods are normally applied to dispense polishing slurries in a manufacturing environment—manual transport in containers, and integrated chemical delivery systems. Using presently available technology, neither of these methods is fully satisfactory.

The simplest dispense method is the manual transport of chemicals to the CMP apparatus pre-mixed in containers (e.g., 5 gallon (18.9 liter) containers). With typical usage rates, this may account for the movement of well over a hundred gallons of slurry into a clean environment during a normal work shift. Among the problems with this approach are possibly inconsistent chemical quality, high traffic volume through a clean environment (for delivery and removal of containers), high chemical handling costs, high packaging costs, high container disposal costs, as well as increased contamination, quality control, and safety risks.

A more sensible approach is the pumping of chemicals to the CMP process equipment from a remote site in a manufacturing facility through continuous tubing from a remote chemical room to polish and post-polish clean areas. This allows the purchase of chemicals in high volume drums (e.g., 200 liter (55 gallon)) or totes (e.g., up to 1250 liter (330 gallon)) at significantly reduced bulk purchase and handling costs. A remote chemical room also eliminates the traffic into a fab and allows safer and more efficient handling of chemicals. Other advantages of such systems include total system interface and optional protocols (e.g., leak detection, demand queuing, on-line monitoring or sampling, integrated temperature control, system flush and clean, data acquisition, remote monitoring and control, etc.)

The movement of slurry from a remote chemical room to CMP process equipment may be accomplished in a variety of ways. Pumps, such as pumps employing polytetrafluoroethylene (PTFE) (e.g., TEFLON®) diaphragms, remain the most common method of moving chemicals around a process facility. Unfortunately, when moving abrasive slurries, such pumps experience considerable wear. In a high utilization area, a PTFE diaphragm may need to be replaced every two to three months. This presents considerable cost in parts, labor, and down-time.

A far more satisfactory system is the use of a vacuum-pressure chemical distribution apparatus, such as that disclosed in U.S. Pat. Nos. 5,148,945 to Geatz and 5,330,072 to Ferri et al., and commercially available from Applied Chemical Solutions, Hollister, Calif. Instead of using in-line pumps, these devices employ intermediate vessels that are sequentially decompressed to draw chemicals in and pressurized to force chemicals out to a point of use. Continuous chemical delivery is accomplished by employing multiple intermediate vessels, alternating between one vessel drawing chemical in under vacuum while the other vessel dispenses chemical under pressure. Since no pumps are employed in the chemical conduits, problems with premature pump wear are eliminated. While such systems provide dramatically improved performance over conventional pump-driven integrated slurry delivery systems, they still do not address all of the operating concerns found in CMP processing, such as producing and handling of highly demanding polishing slurries.

For instance, in order to address some of the various handling concerns previously explained, chemical is usually temporarily stored in a "day tank" immediately prior to use, where agitation, pH, and/or temperature control can be performed. This reduces some of the mixing and separation issues previously discussed, but does not address problems of very short shelf life or highly aggressive abrasive compositions found with some slurry compositions (e.g., certain metal removing slurries).

Accordingly, it is a primary object of the present invention to provide an improved integrated system for the delivery of polishing chemicals and similar compositions to a point of use that is flexible in the types of chemicals it can handle and is not susceptible to premature wear or attack from abrasive chemical mixtures.

It is another object of the present invention to provide an apparatus and method for the delivery of chemicals that can readily handle highly sensitive chemical mixtures, including mixtures with short shelf lives or requiring demanding mixing parameters.

These and other objects of the present invention will become evident from review of the following specification.

SUMMARY OF THE INVENTION

The present invention is an improved integrated system for the production and delivery of chemical slurry materials to production facilities, such as the formation and delivery of polishing slurries used in Chemical-Mechanical Polishing (CMP) processes.

The preferred apparatus of the present invention comprises a measuring vessel of predetermined volume in communication with multiple sources of chemical components. Each component chemical is first measured in the measuring vessel and then transferred to one or more mix or "day" tanks. Multiple chemicals are combined in the mix tank to produce a slurry for use at a downstream facility. A pressure-vacuum vessel (PVV) system is then employed to draw chemical from the mix tank and deliver it to CMP or other processing equipment. The provision of numerous flow paths in the present invention provides almost endless flexibility in mixing and maintenance options for the chemicals. Further, the present invention provides means to readily mix solid chemical components into a slurry chemical stream to provide even greater chemical delivery options.

Among the advantages of the apparatus and method of the present invention is that highly abrasive chemicals can be transferred without the need for in-line pumps and other apparatus that may deteriorate. Further, the present invention allows chemicals to be mixed and delivered under customized conditions, including relatively rapid mixing and the ability to mix and deliver chemicals on demand (either immediate or from a batch).

DESCRIPTION OF THE DRAWINGS

The operation of the present invention should become apparent from the following description when considered in conjunction with the accompanying drawings, in which:

FIG. 2d is a schematic drawing of a fourth flow path through the slurry distribution system of FIG. 1, illustrating a distribution loop recirculation flow;

DETAILED DESCRIPTION OF THE INVENTION

The present invention is an improved apparatus and method for mixing and distributing chemical slurries, and particularly for the mixing and distributing of highly abrasive slurry mixtures such as those employed in Chemical-Mechanical Polishing (CMP) processing.

Figure 1A:
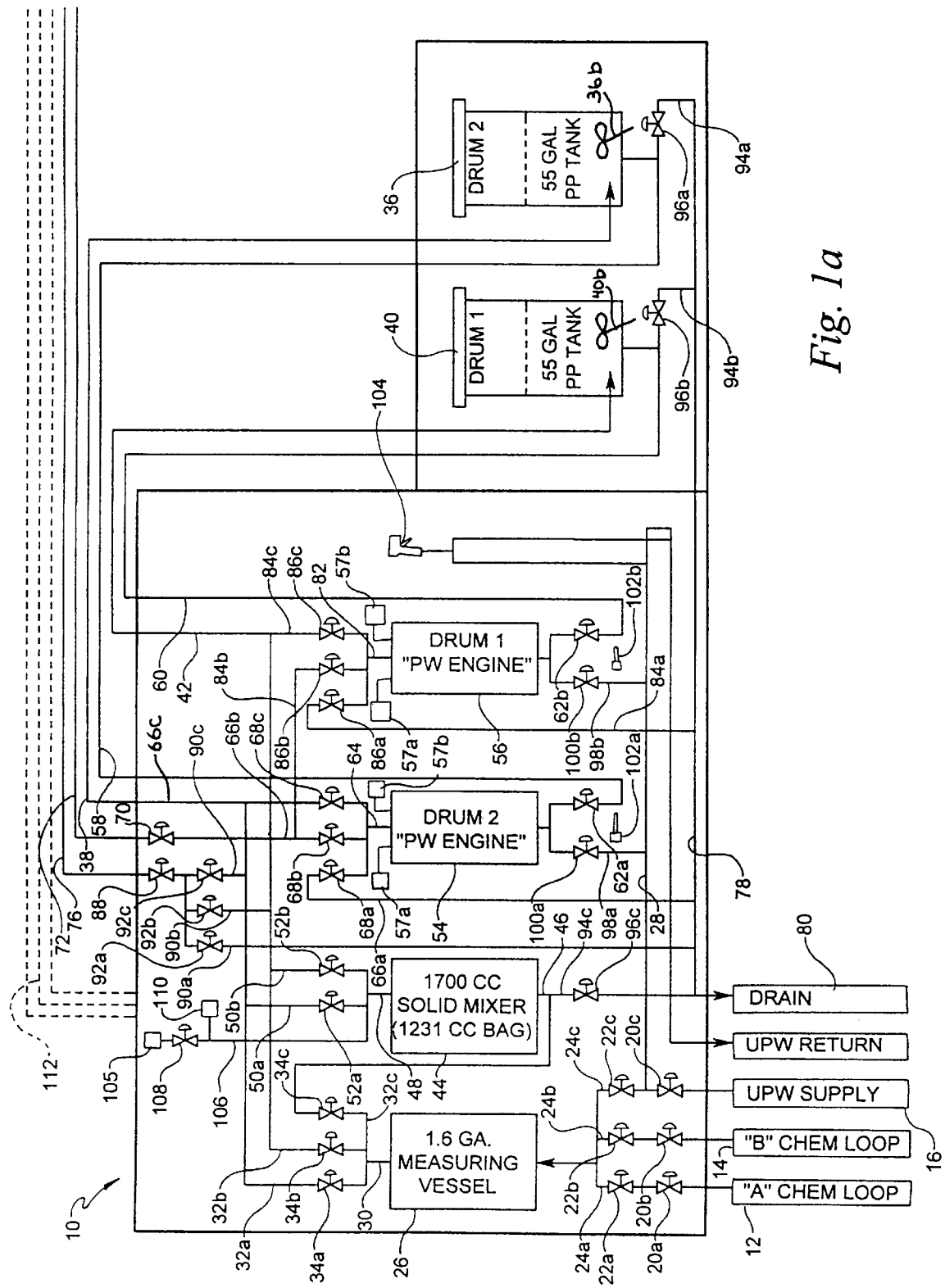
FIG. 1a is a more detailed schematic drawing of the left side of the slurry distribution system shown in FIG. 1.
Figure 1B:
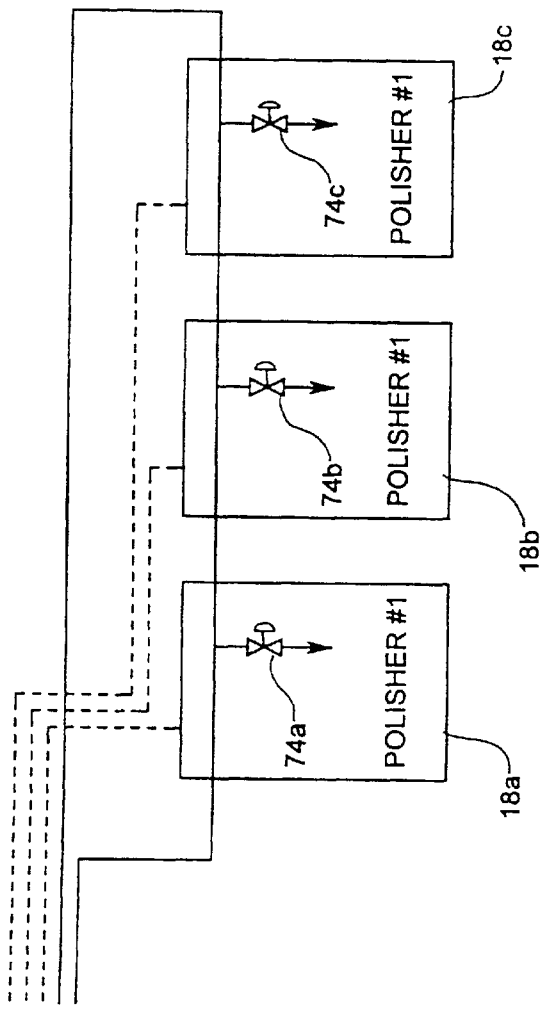
FIG. 1b is a more detailed schematic drawing showing the right side of the slurry distribution system of FIG. 1.
Figure 1:
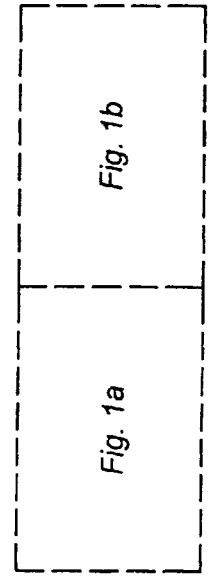
FIG. 1 is a schematic drawing of a first embodiment of a slurry distribution system of the present invention.

Shown in FIG. 1 is one embodiment of an apparatus 10 of the present invention. The apparatus is adapted to transfer chemical from one or more upstream sources 12, 14, 16 of chemical and distribute the chemical to one or more downstream facilities 18a, 18b, 18c, such as point-of-use CMP polishers or intermediate storage facilities. The upstream sources of chemical may comprise any suitable source of process chemical, such as chemical drums or chemical totes. Additionally, as is illustrated, the upstream source of chemical may likewise comprise a conduit connected to a deionized or ultra pure water (UPW) supply 16 or other continuous source of chemical.

In the embodiment shown, each of the upstream sources 12, 14, 16 is controlled by manual valves 20a, 20b, 20c and automatic valves 22a, 22b, 22c, on conduit lines 24a, 24b, 24c, respectively. Each of conduit lines 24a, 24b, 24c are connected to a measuring vessel 26. Line 24c is also connected to conduit line 28, as is explained below.

The measuring vessel 26 serves to provide a multiple or exact measurement of the amount of each chemical dispensed from the source 12, 14, or 16 (i.e., the measuring vessel may be filled repeatedly to reach the desired quantity of chemical or it may be sized to provide the necessary amount of chemical on a single filling). The vessel shown comprises a tank holding approximately 1.6 gallons of liquid. Sensors (not shown) may be provided on the tank to provide automatic shut-off of flow to the measuring vessel 26 when the vessel is filled to a desired amount. The measuring vessel may be filled through any known manner, including by providing pumps, by placing the sources 12, 14, and/or 16 under pressure, by elevating the sources above the level of the measuring vessel to provide gravity feed, or by placing the measuring vessel under vacuum so as to draw chemical into the vessel.

Liquid exits the measuring vessel 26 through conduit line 30, where it may be directed through one of three different flow paths via lines 32a, 32b, and 32c. Flow through each of lines 32a, 32b, 32c is controlled by automatic valves 34a, 34b, 34c, respectively. Chemical exiting via line 32a may be routed to mix tank 36 via line 38. Chemical exiting via line 32b may be routed to mix tank 40 via line 42.

The mix tanks 36, 40 serve a variety of purposes in the present invention. First and foremost, these tanks serve as mixing vessels where measured quantities of chemical may be delivered and combined to produce precisely mixed slurries for use by the downstream facilities. Second, these tanks may act as a temporary storage area from which chemical slurry may be taken upon demand from a downstream facility 18. Third, by incorporating mechanisms 36b and 40b into the mix tanks, such as agitators (e.g., rotating paddled baffles, gas sparger systems, ultra-sonic vibrators, etc.), heating or cooling systems, etc., the chemical compositions stored in the mix tanks may be maintained thoroughly mixed and viable even if they are not used immediately. Such regular mixing is believed to be important for most applications, but may be particularly important in instances where chemical separation or precipitation is likely to occur, such as when solid suspensions are created in the manner described below.

Chemical exiting via line 32c may be routed to solid mixer 44 via line 46. The solid mixer 44 comprises a receptacle holding a solid chemical component (e.g., particulate, crystal, or cake) that is to be mixed with the liquid chemical component from the measuring vessel 26. As is explained in greater detail below, the present invention directs a stream of liquid chemical through the solid mixer 44 and the solid chemical component becomes entrained within the chemical stream (e.g., by dissolving within the liquid chemical component or by merely becoming suspended therein). This apparatus is particularly suitable for rapidly mixing chemical compositions that have short shelf lives and that must be used a short time after formation. Chemical exits the solid mixer 44 via line 48, where it may be directed through either line 50a or 50b. Flow into lines 50a and 50b is controlled by automatic valves 52a, 52b.

Line 50a routes chemical into line 32a and then into line 38 and mix tank 36. Line 50b routes chemical into line 32b and then into line 42 and mix tank 40.

As has been explained, in integrated delivery systems it is very common for the chemical supplies to be installed in separate remote chemical rooms or in a case removed from the downstream process equipment. In light of such separation, it is quite important that a reliable mechanism be provided to deliver chemical to the downstream facilities, and, if required, recirculate chemical from such facilities during periods of low demand. Previous attempts to use conventional pumps to motivate chemical under such conditions have proven relatively unsuccessful since aggressive polishing slurries will rapidly degrade the pump mechanisms, vastly increasing maintenance time and costs.

In the present invention, it is preferred to employ one or more pressure-vacuum vessel (PVV) assemblies 54, 56 as "engines" to move chemical from the mix tanks 36, 40 to downstream facilities 18. These devices are described at length in U.S. Pat. Nos. 5,148,945 to Geatz and 5,330,072 to Ferri et al., each incorporated by reference. A pressure-vacuum vessel assembly comprises multiple sealed canisters connected to both a vacuum generator 57a and a pressure source 57b, such as a compressed gas generator or tank. Instead of pumping chemical, a negative pressure is established in the vessel and chemical is drawn into the vessel under a partial vacuum. Once the vessel is filled, the vessel is pressurized so as to drive the chemical from the vessel under pressure to its final destination.

By operating two or more of PVV assemblies in parallel, with one vessel filling while the other vessel is emptying, a constant flow of liquid can be delivered by such a system. By coordinating the change-over between the filling and emptying of the vessels, it has been shown that a constant uninterrupted and non-pulsed flow can be delivered from such a system vastly superior to the "pulsing" flow commonly delivered by a pump system. More importantly in the realm of slurry distribution, the use of PVV assemblies removes all pump mechanisms and similar obstructions from the fluid path. This not only reduces contamination risk, but also eliminates the maintenance problems inherent with the exposure of moving parts to aggressive slurry chemicals.

For use in the present invention, each of the PVV assemblies 54, 56 may comprise a single canister assembly or, preferably, comprises multiple canisters arranged in parallel. In those instances where quantities of slurry required are relatively minimal, it may be possible to use a single canister to deliver uninterrupted flow.

In the present invention, PVV assembly 54 is connected to mix tank 36 via line 58 and PVV assembly 56 is connected to mix tank 40 via line 60. Flow into the PVV assemblies 54, 56 is controlled by automatic valves 62a, 62b, respectively. Chemical exits PVV assembly 54 via conduit line 64 and may be directed to one of three flow paths, lines 66a, 66b, or 66c. Flow through each of lines 66a, 66b, and 66c is controlled by automatic valves 68a, 68b, and 68c, respectively.

In order to deliver chemical to a downstream facility 18, chemical is directed through line 66b, past valve 70, and to the downstream facility via conduit line 72. Chemical is delivered upon demand to the downstream facilities 18a, 18b, 18c by opening dispense valves 74a, 74b, 74c, respectively. It should be understood that the present invention may be used to supply chemical to any desired number of downstream facilities. If some or all of the chemical slurry is not needed at the downstream facilities, then chemical is returned to the dispense apparatus via return line 76.

Chemical exiting PVV assembly 54 through line 66c is directed back to mix tank 36 via line 38. This recirculation path may be very important during periods of low demand, assuring constant movement of the chemical slurry and far better mixing of the chemical components. In fact, such circulating and mixing may be crucial to proper chemical mixture where the mix tanks are not provided with agitation or other mixing means.

Chemical exiting PVV assembly 54 through line 66a is routed to drain line 78 and ultimately to drain 80. The drain line 78 and drain 80 are used when the system must be emptied for service or cleaned or chemical change over.

A similar routing system is provided for chemical exiting PVV assembly 56. Chemical exits PVV assembly 56 via conduit line 82 and may be directed to one of three flow paths, lines 84a, 84b, or 84c. Flow through each of lines 84a, 84b, and 84c is controlled by automatic valves 86a, 86b, and 86c, respectively. Chemical exiting via line 84b is directed through the same path as chemical exiting PVV assembly 54 via line 66b (i.e., through valve 70 and to the downstream facilities 18 by way of line 72). Chemical exiting via line 84c is recirculated to mix tank 40 via line 42. Chemical exiting via line 84a is directed to drain line 78 and drain 80.

Chemical returning from the downstream facilities 18 via line 76 may be dispensed in a number of different ways. Flow out of line 76 is controlled by manual valve 88 and may be directed to one of three possible flow paths, lines 90a, 90b, and 90c. Flow through each of these lines is controlled by automatic valves 92a, 92b, 92c. Flow through line 90a passes to drain line 78 and drain 80. Flow through line 90b passes to line 32b and to mix tank 40 via line 42. Flow through line 90c passes to line 32a and to mix tank 36 via line 38.

It should be evident from this description that chemical returning from the downstream facilities may be directed into any desired flow path in the apparatus, including back to the chemical's original mix tank, to a different mix tank, or to a drain for disposal. Once again, these flow options assure that chemical continues to move and mix even during periods of low demand or no demand.

To increase the use options of the apparatus of the present invention, a number of other optional flow paths are also provided. For instance, to aid in flushing the system of chemical when required, drain lines and associated valving are provided on many of the components of this system. These include: line 94a and associated valve 96a from mix tank 36; line 94b and associated valve 96b from mix tank 40; and line 94c and associated valve 96c from solid mixer 44. Assisting in flushing the system with water during cleaning cycles are lines 98a and 98b, with associated valves 100a, 100b, providing connection between UPW line 28 and each of the PVV assemblies 54, 56.

Other useful accessories provided with this apparatus include: sensors 102a, 102b, on each of lines 58 and 60 to monitor the assay of liquid in the lines before opening of valves 62a or 62b; and water gun 104 connected to UPW line 28 and drain line 78 to supply ultra pure water in the apparatus when required. Suitable sensors 102 for use in the present invention may include: pH electrodes, ion selective electrodes, resistivity probes, specific gravity sensors, temperature sensors, etc.

Finally, a compressed gas system 105 is connected to the solid mixer 44 via line 106 and controlled by valve 108 and pressure switch 110. The pressure switch 110 is a pressure sensor used to test the pneumatic seal of the solid mixer 44 (solid dissolve) after each placement of solids in the solid mixer 44 prior to allowing liquid into that vessel. This system provides compressed gas, such as nitrogen, to assist in forcing liquid through the solid mixer 44 and associated lines during maintenance. The compressed gas used in the PVV assembly systems may likewise be used for these purposes with appropriate connections.

While the above described system may be operated manually, it should be understood that it is particularly designed to accommodate automatic switching of valves so as to assure hands-off operation responding only to downstream facility demand and the need for regular circulation of chemical during low demand periods. In this regard, electronic connections 112 should be included between the downstream facilities and the apparatus 10 of the present invention. These connections 112 may be used by a microprocessor or similar device to monitor demands on the system and to respond to such demands by shifting flow paths. While any valve allowing electronic control may be used for automatically operated valves in the present invention, it is preferred to use pneumatically operated diaphragm-type valves, such as an INTREGRA model valve available from Fluoroware Inc. of Chaska, Minn.

It should be appreciated from the above description that a vast number of possible flow paths may be employed with the apparatus of the present invention. A mere sampling of such flow paths are illustrated in FIGS. 2a through 2i.

Figure 2A:
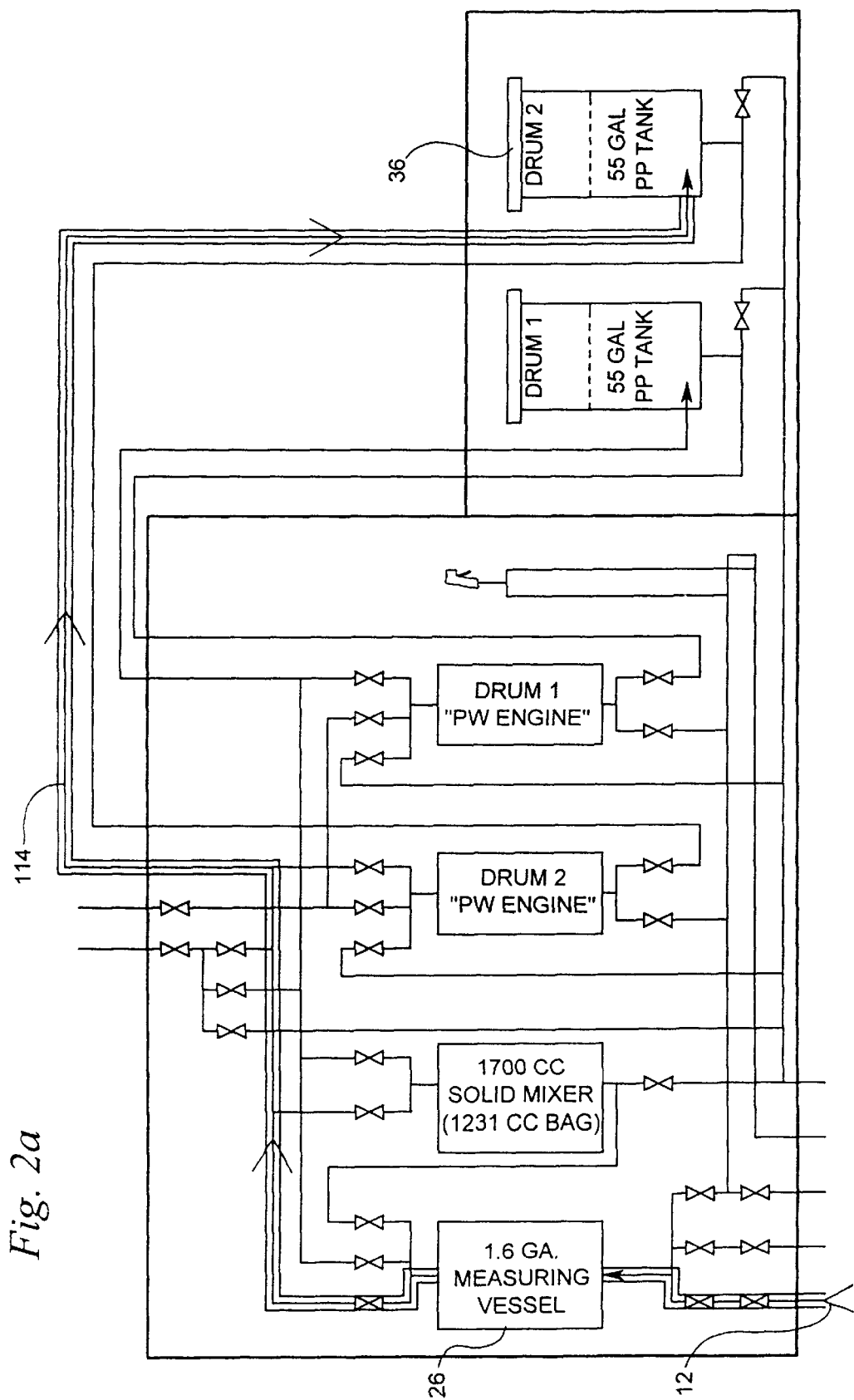
FIG. 2a is a schematic drawing of a first flow path through the slurry distribution system of FIG. 1, illustrating an example of a liquid measuring flow.

FIG. 2a demonstrates one flow path 114 (of about six possible flow paths) for providing a measured amount of a single chemical from a chemical source 12 through measuring vessel 26, and to mix tank 36. Alternative flow paths may direct chemical from any of the three sources 12, 14, or 16 to either of the two mix tanks 36 or 40.

Figure 2B:
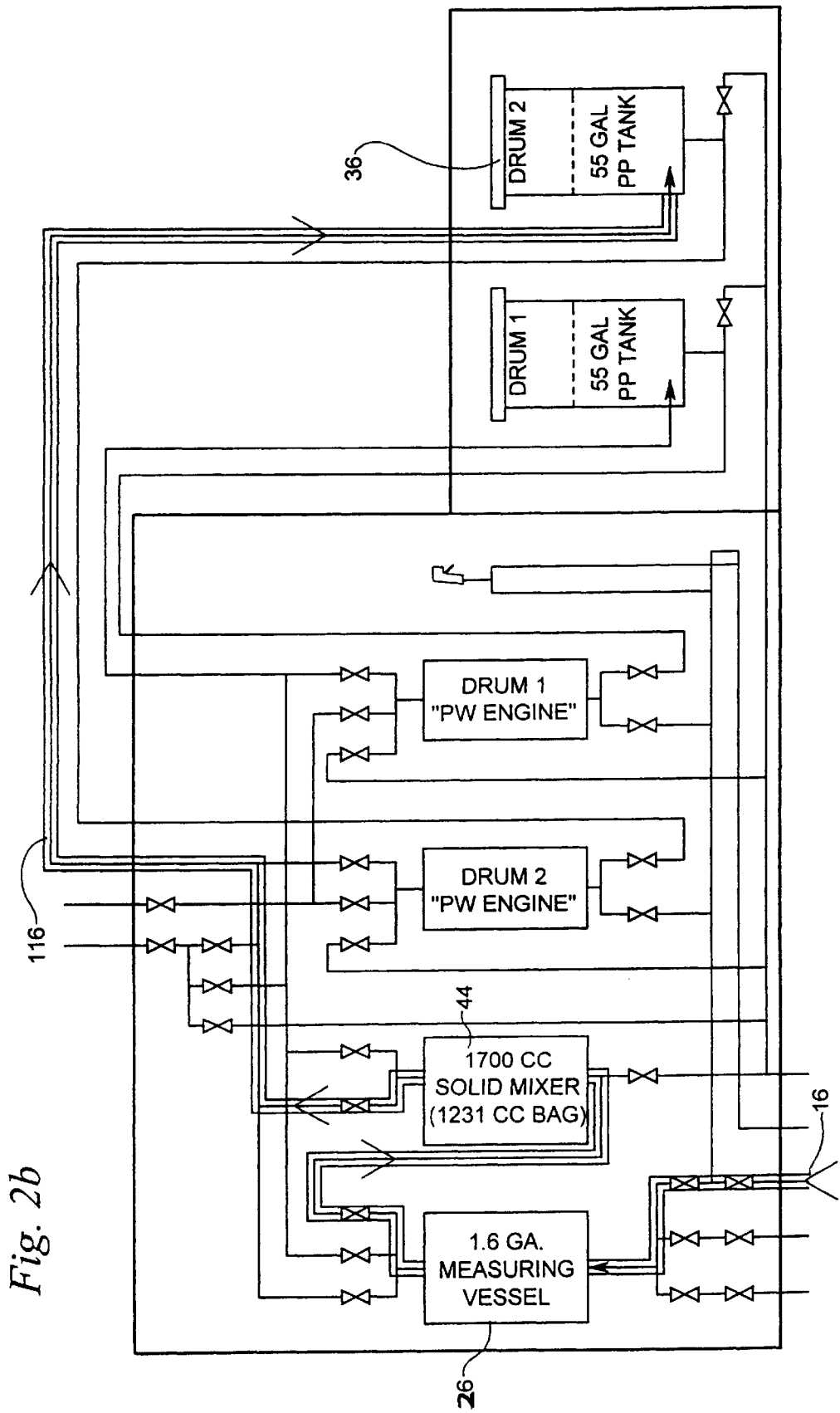
FIG. 2b is a schematic drawing of a second flow path through the slurry distribution system of FIG. 1, illustrating an example of a solid dissolve and distribution flow.

FIG. 2b demonstrates a flow path 116 (of about two possible flow paths) for entraining a solid chemical component to a flow of ultra pure water. This flow path 116 takes UPW from source 16, through measuring vessel 26, through solid mixer 44, and into mix tank 36.

Figure 2C:
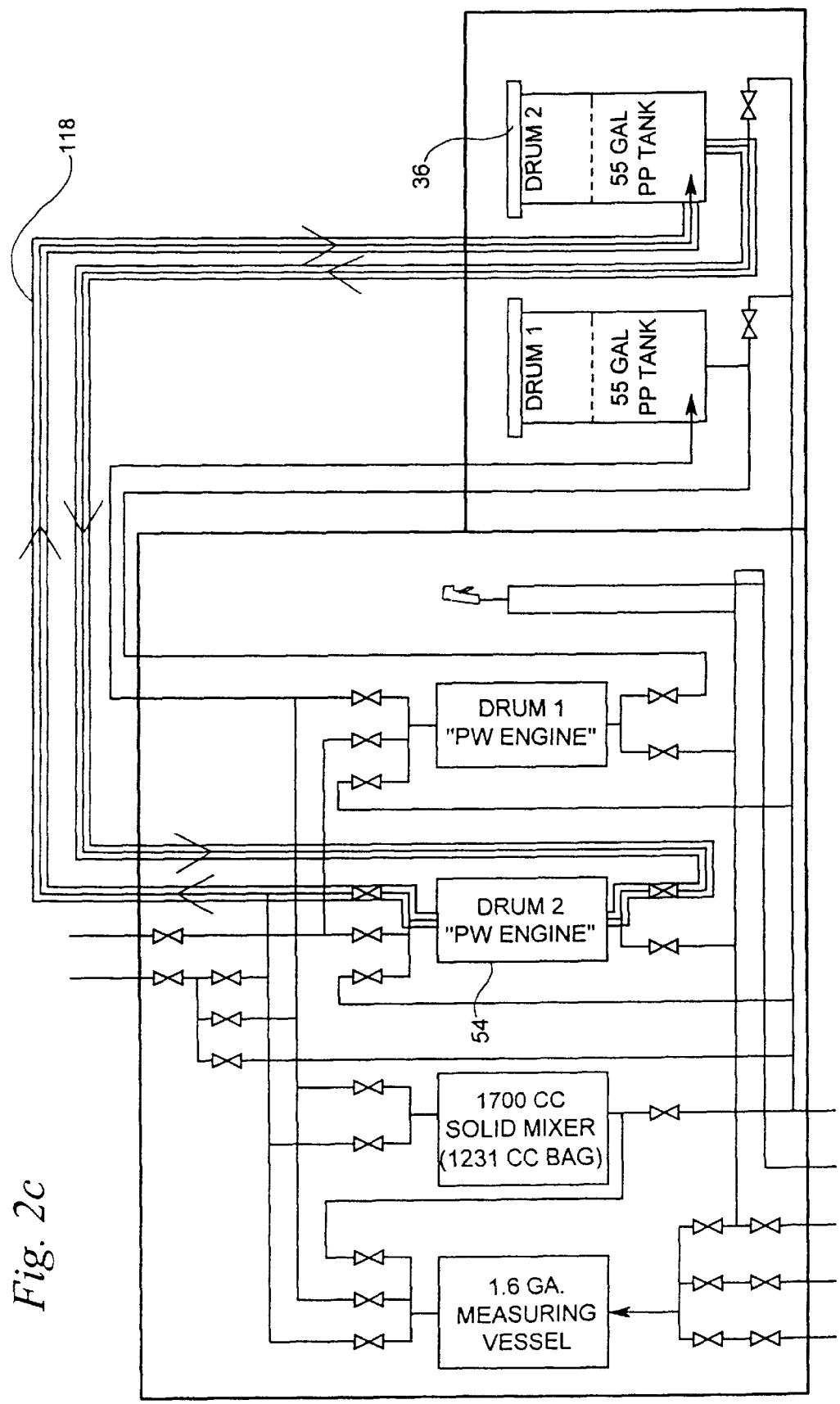
FIG. 2c is a schematic drawing of a third flow path through the slurry distribution system of FIG. 1, illustrating a mix drum recirculation flow.

FIG. 2c demonstrates a flow path 118 (of about two possible flow paths) for recirculating chemical slurry between mix tank 36 and PVV assemblies 54.

FIG. 2d demonstrates a flow path 120 (of about two possible flow paths) for distributing chemical slurry from mix tank 40, through PVV assemblies 56, to the downstream facilities via line 72, and recirculated back from the downstream facilities via line 76, and to mix tank 40.

Figure 2E:
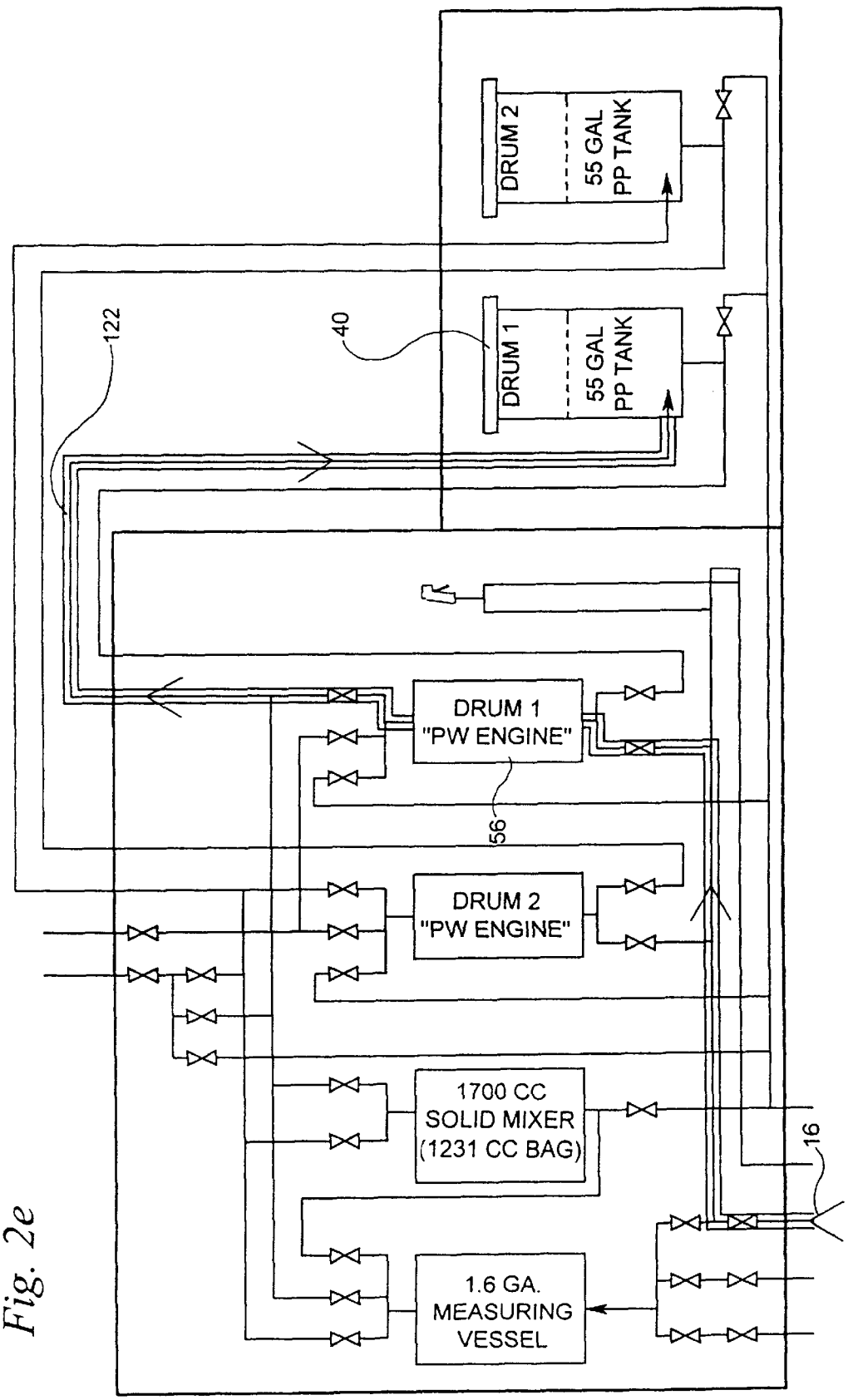
FIG. 2e is a schematic drawing of a fifth flow path through the slurry distribution system of FIG. 1, illustrating a flush of a pressure-vacuum vessel (PVV) assembly flow.

FIG. 2e demonstrates a flow path 122 (of about two possible flow paths) for flushing a portion of the apparatus with UPW. Water is directed from source 16, through PVV assembly 56 (flushing the PVV assembly in the process), and filled into mix tank 40.

Figure 2F:
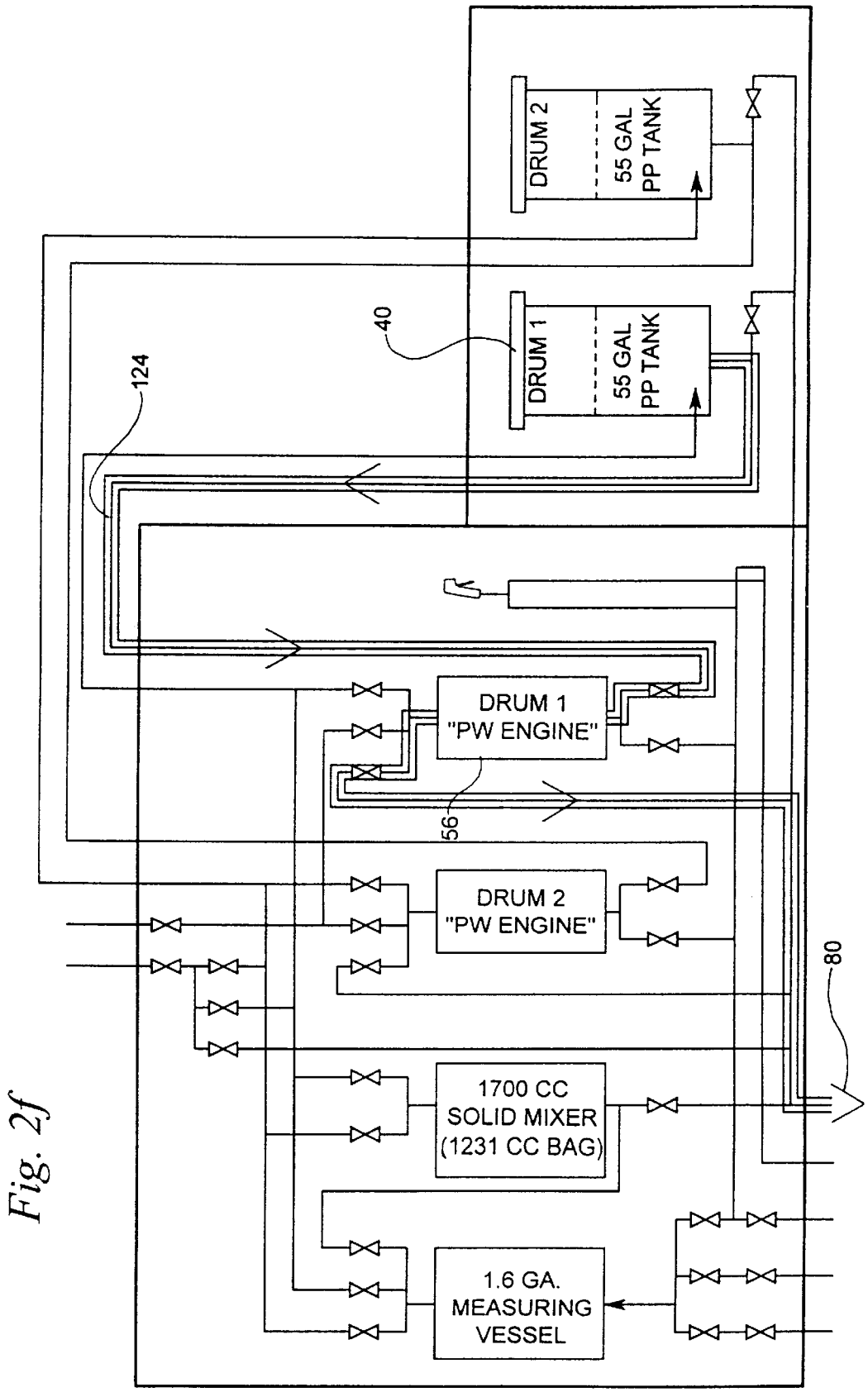
FIG. 2f is a schematic drawing of a sixth flow path through the slurry distribution system of FIG. 1, illustrating a mix drum to drain flow through a PVV assembly.

FIG. 2f demonstrates a flow path 124 (of about two possible flow paths) for draining mix tank 40 through PVV assembly 56, and out drain 80.

Figure 2G:
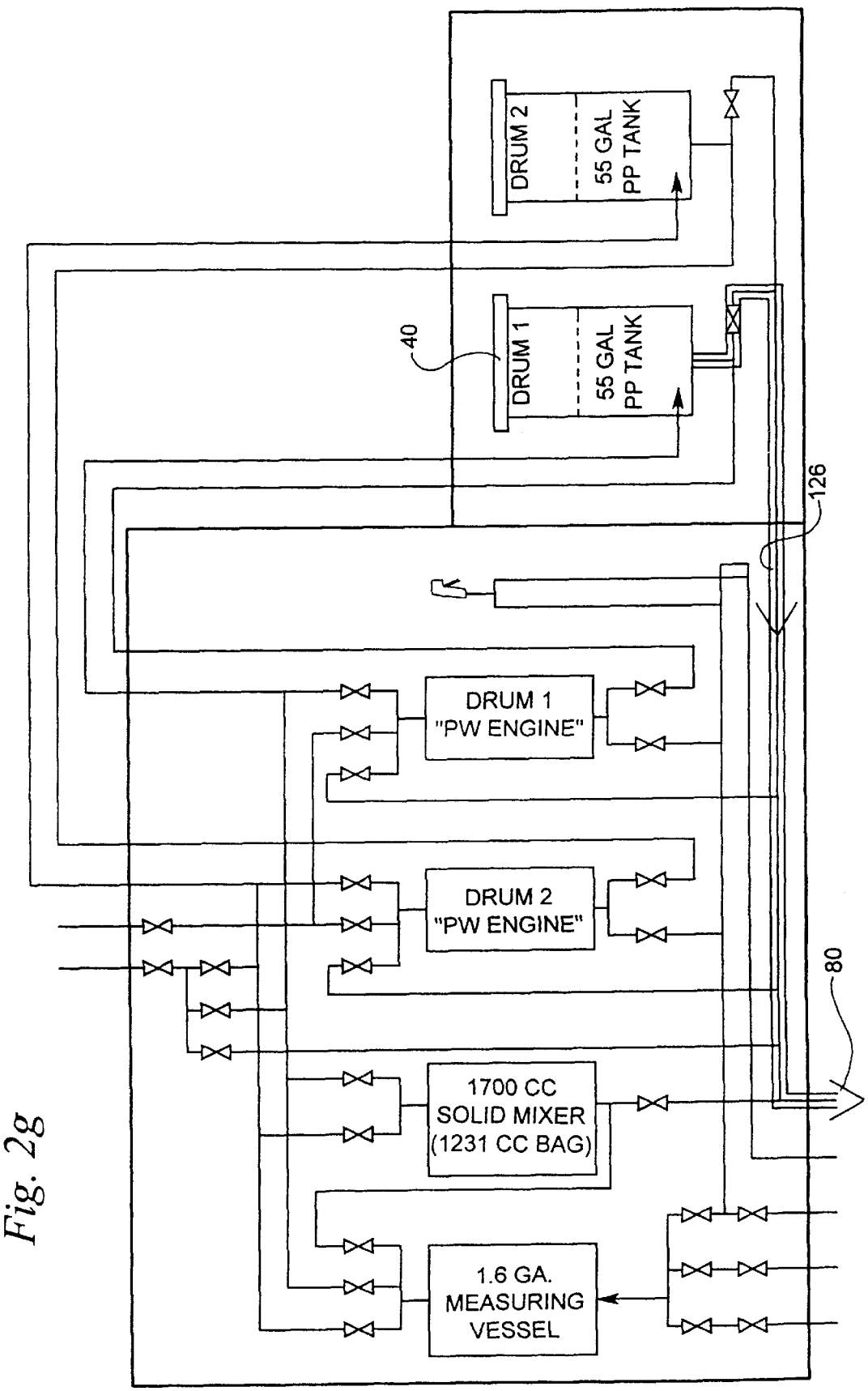
FIG. 2g is a schematic drawing of a seventh flow path through the slurry distribution system of FIG. 1, illustrating a mix drum to drain flow.

FIG. 2g demonstrates a flow path 126 (of about two possible flow paths) for draining mix tank 40 out drain 80.

Figure 2H:
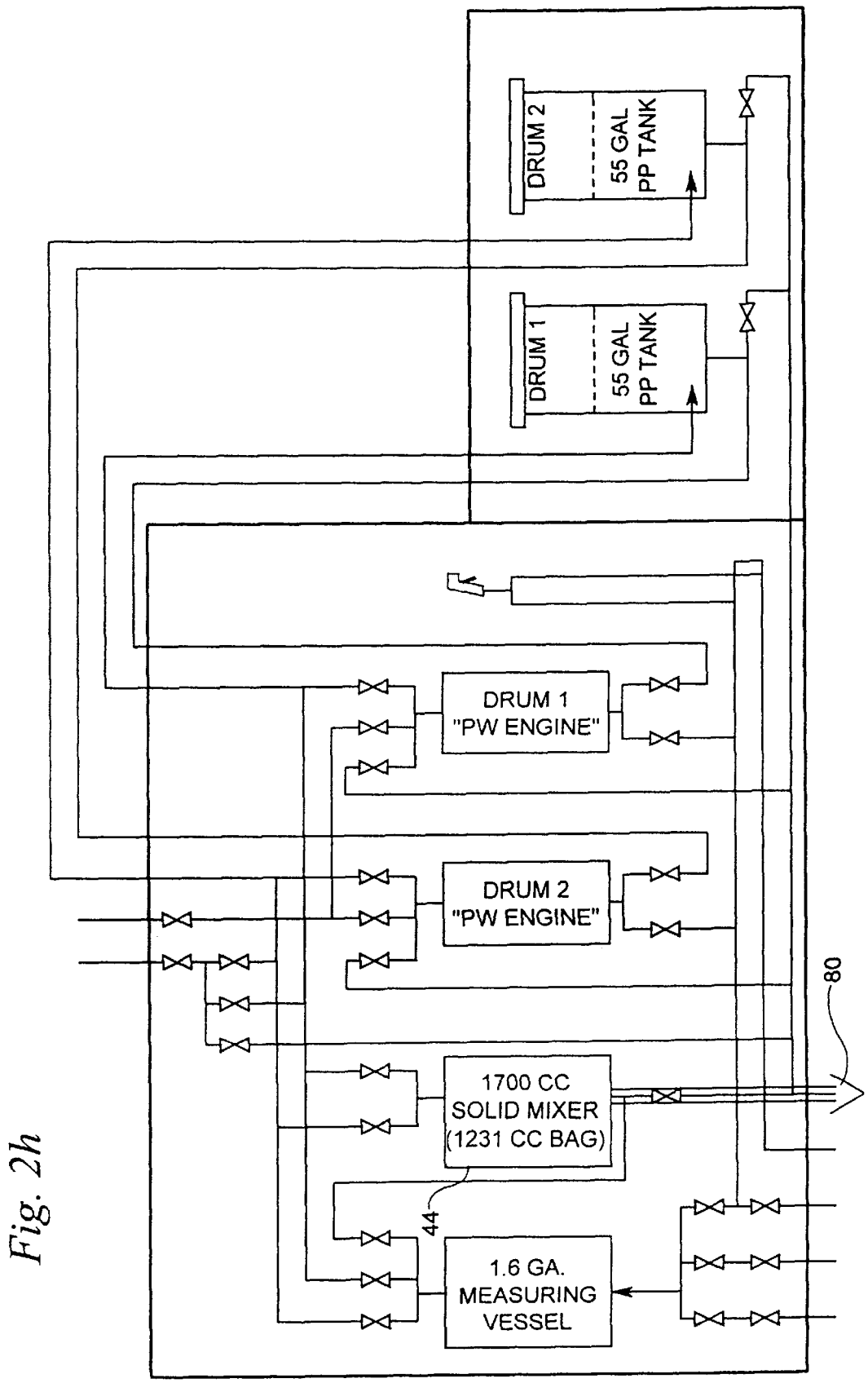
FIG. 2h is a schematic drawing of an eighth flow path through the slurry distribution system of FIG. 1, illustrating a solid dissolve vessel to drain flow.

FIG. 2h demonstrates a flow path 128 (of about two possible flow paths) for draining solid mixer 44 out drain 80.

Figure 2I:
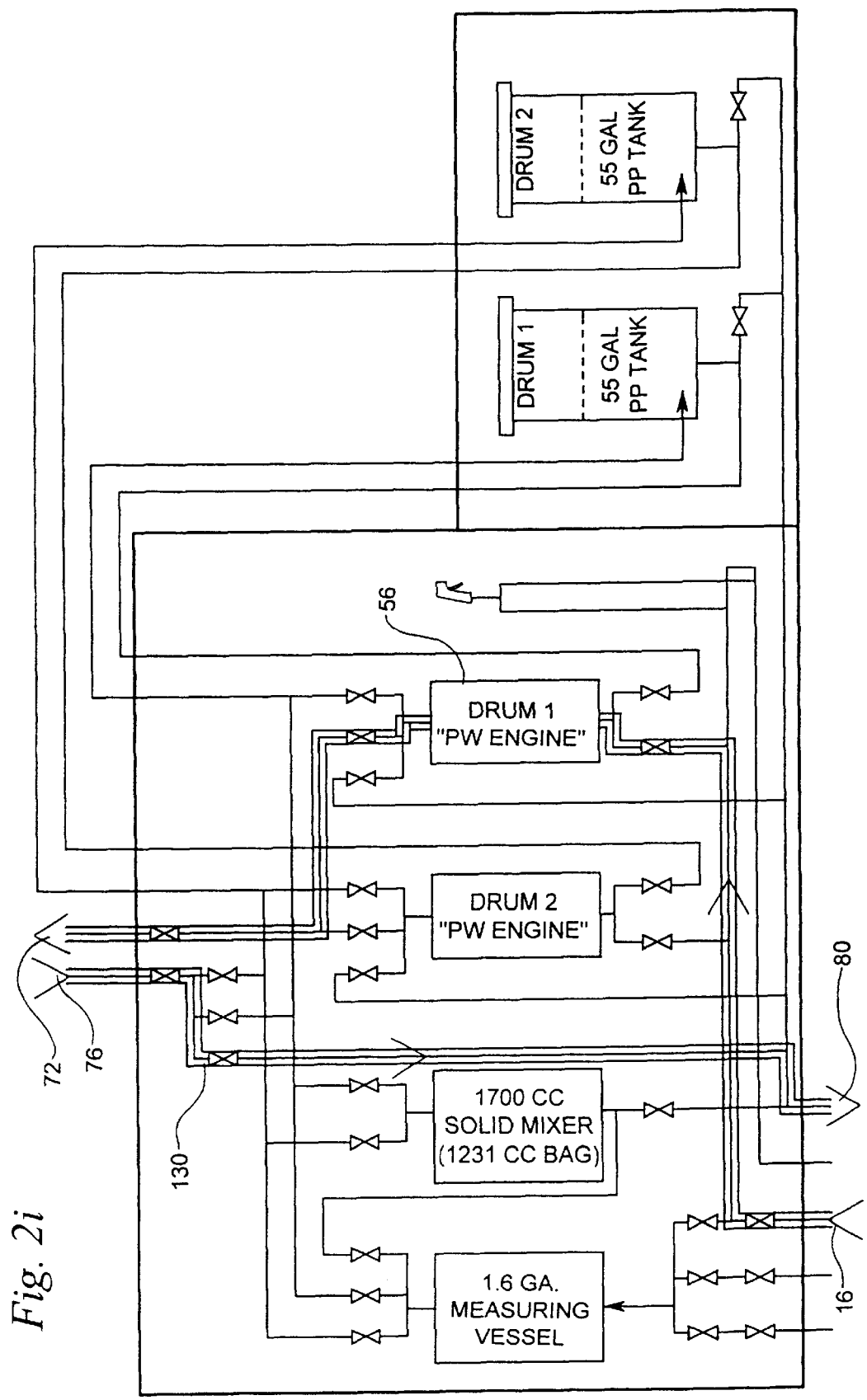
FIG. 2i is a schematic drawing of a ninth flow path through the slurry distribution system of FIG. 1, illustrating a distribution/loop flow.

FIG. 2i demonstrates another flow path 130 (of about two possible flow paths) for flushing a portion of the apparatus with UPW. In this instance, water is directed from source 16, through PVV assembly 56, out line 72, back line 76, and out drain 80.

As has been noted, numerous other flow paths may be readily provided with the apparatus of the present invention. As such, the apparatus is capable of taking virtually any chemical materials, from a variety of possible sources, mixing them, maintaining them in a mixed state, and delivering them upon demand to an end-use or intermediate facility. The apparatus of the present invention is particularly useful where slurry chemicals having very short shelf life or difficult handling requirements are specified.

One of the more important advances of the present invention is the provision of multiple mix tanks. By providing two or more tanks arranged in parallel, each tank can be maintained with a supply of slurry to assure constant delivery to downstream facilities upon demand. Additionally, this arrangement allows one tank to be taken off line for maintenance or repair without the need to shut down the entire system.

It is believed that the apparatus of the present invention may be used with virtually any combination of chemicals used to generate chemical slurries. Additional chemical sources, either liquid or solid, may be readily incorporated into the present invention without departing from its intent.

The apparatus of the present invention is believed to be particularly effective at mixing and delivering chemical compositions that are generally difficult to mix or handle. Some of these compositions require instantaneous mixing and distribution. This can be readily accomplished with the apparatus of the present invention by distributing chemical components into the mix tanks only upon demand from a down stream facility and then immediately dispensing the chemical composition from the mix tank to the downstream facility. The accuracy, flexibility, and speed possible with the present invention allows this form of on-demand delivery which has been previously impractical to supply through an integrated system.

Figure 3:
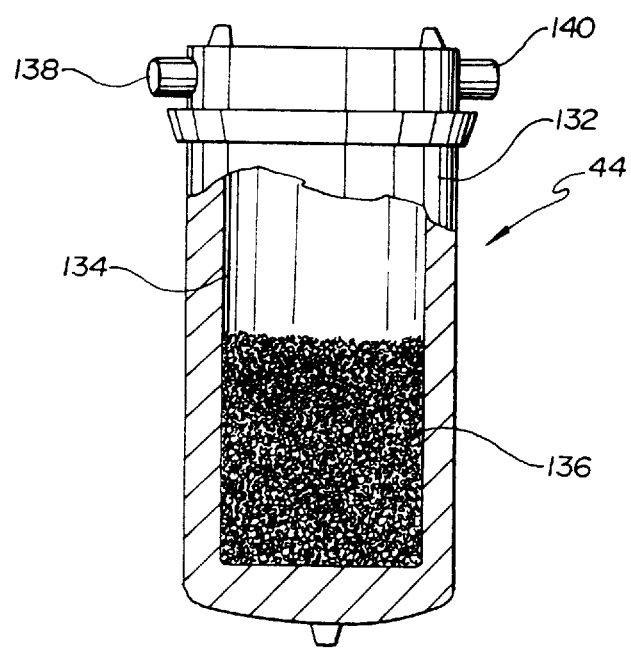
FIG. 3 is a front elevation view of a solid dissolve vessel for use in the present invention, with a portion of its casing cut away to reveal its interior.

One of the elements of the present invention that makes it particularly unique is its ability to readily entrain various solid materials into a chemical stream through the use of the solid mixer 44. As is shown in FIG. 3, the preferred solid mixer comprises a receptacle 132 housing a permeable liner 134. The liner 134 is filled with the solid material 136 to be mixed and liquid flow is directed through the receptacle 132 by attaching the solid mixer 44 to fluid conduits via fittings 138, 140.

Although in no way designed for such an application, it has been found that a conventional filter cartridge or filter bag, such as one constructed from expanded polytetrafluoroethylene, will readily serve as a permeable liner 134 for the present invention. The permeability of the liner should be adjusted to match the flow rate of the chemical passing through the solid mixer and the speed at which the solid material becomes entrained within the liquid stream. This structure is believed to be suitable for mixing a wide variety of solid chemical components into a liquid chemical stream.

Although particular embodiments of the present invention are disclosed herein, it is not intended to limit the invention to such a disclosure and changes and modifications may be incorporated and embodied within the scope of the following claims.

The invention claimed is:

1. Apparatus for the delivery of a chemical slurry to at least one downstream facility that comprises a measuring vessel of predetermined volume into which a liquid chemical component is introduced;

a conduit connecting the measuring vessel to multiple chemical sources, wherein each of said chemical sources comprises a liquid chemical component;

a conduit connecting the measuring vessel to at least one mix tank;

a pressure vacuum vessel in communication with said at least one mix tank whereby chemical is drawn from said at least one mix tank to the pressure-vacuum vessel under negative pressure and chemical is delivered from the pressure-vacuum vessel to said at least one downstream facility under positive pressure, the pressure-vacuum vessel being in fluid communication with both said at least one mix tank and said at least one downstream facility;

valves on each of the conduits so as to control chemical flow therethrough;

wherein the chemical slurry is produced in said at least one mix tank by combining chemicals from at least one of the multiple chemical sources and the slurry is delivered from said at least one mix tank to said at least one downstream facility.

2. A method for producing a chemical mixture for use in chemical-mechanical polishing procedures which comprises providing an apparatus having a measuring vessel, the measuring vessel connected to at least two upstream sources of chemicals;

providing a connection between the measuring vessel and at least one mix tank;

providing means to motivate chemical from said at least one mix tank to a downstream facility, wherein said motivating means comprises at least one pressure-vacuum vessel;

filling the measuring vessel with a first component chemical, and then transferring the first component chemical to said at least one mix tank;

filling the measuring vessel with a second component chemical, and then transferring the second component chemical to said at least one mix tank;

mixing the component chemicals in said at least one mix tank to produce the chemical mixture; and delivering the chemical mixture from said at least one mix tank to the downstream facility using said motivating means.

3. The method of claim 2 wherein the delivering step comprises drawing the chemical mixture from said least one mix tank to the pressure-vacuum vessel under a negative pressure and delivering the chemical mixture from the pressure-vacuum vessel under a positive pressure to the downstream facility.

4. The method of claim 2 that further comprises providing multiple mix tanks, each mix tank connected to the measuring vessel and the downstream facility;

adjusting flow of the component chemicals to different mix tanks from the measuring vessel as is necessary to maintain a constant supply of chemical for the downstream facility.

* * * * *